United States Patent [19]

Bastida

[11] 4,340,873
[45] Jul. 20, 1982

[54] PERIODIC TRANSMISSION STRUCTURE FOR SLOW WAVE SIGNALS, FOR MINIATURIZED MONOLITHIC CIRCUIT ELEMENTS OPERATING AT MICROWAVE FREQUENCY

[75] Inventor: Ezio M. Bastida, Segrate, Italy

[73] Assignee: CISE Centro Informazioni Studi Esperienze S.p.A., Italy

[21] Appl. No.: 154,683

[22] Filed: May 30, 1980

[30] Foreign Application Priority Data

Jun. 28, 1979 [IT] Italy .............................. 23949 A/79

[51] Int. Cl.³ .............................................. H01P 9/00
[52] U.S. Cl. .................................... 333/161; 333/156; 333/238; 333/246
[58] Field of Search ................ 333/156, 161, 245–246, 333/236–238, 109–112, 202–204, 115, 116, 118, 24 R, 24 C; 315/3.5; 330/4.6–4.7, 5, 49, 53; 307/424

[56] References Cited

U.S. PATENT DOCUMENTS 3,308,336  3/1967  McDowell ....................... 315/3.5 X
3,484,725  12/1969  Sobotka ............................... 333/161

OTHER PUBLICATIONS

Heilmeir–"An Analysis of Parametric Amplification in Periodically Loaded Transmission Lines", RCA Review, Sep. 1959; 442–454.

"Dizionario d'Ingegneria", vol. X, Utet, Turin, Italy, 1978; Title page and p. 383.

Higgins et al.–"Microwave Transistor Amplifiers", 1979 IEEE International Solid–State Circuits Conference, Feb. 15, 1979, Pennsylvania Ballroom/Tham 10.5 CH1375-5/79/0000-0120; pp. 120–121.

Bastida et al.–"Periodic Slow–Wave Low–Loss Structures for Monolithic Ga As Microwave Integrated Circuits", Reprint from Electronics Letters, 13, Sep. 1979, vol. 15, No. 19; pp. 581–582.

Primary Examiner—Marvin L. Nussbaum
Attorney, Agent, or Firm—Karl W. Flocks; A. Fred Starobin

[57] ABSTRACT

The transmission structure comprises at least two parallel conducting bands placed on an support of semi-insulating semiconductor material. Said conducting bands are electrically interconnected by concentrated capacities, which are spaced apart at predetermined distances, which are less than the wavelength of the signal to be transmitted.

6 Claims, 10 Drawing Figures

PERIODIC TRANSMISSION STRUCTURE FOR SLOW WAVE SIGNALS, FOR MINIATURIZED MONOLITHIC CIRCUIT ELEMENTS OPERATING AT MICROWAVE FREQUENCY

This invention relates to a periodic transmission structure for slow wave signals, for miniaturised monolithic circuit elements operating at microwave frequency.

A classical system for forming various types of circuit element (such as filters, directional couplers etc.) operating at microwave frequency consists of using line portions having a length proportional to the signal wavelength (usually $\lambda/2$ or $\lambda/4$).

In constructing monolithic amplifiers, this type of approach has as yet not proved economically advantageous because the constructed circuits have final dimensions which are too large (typically some $cm^2$ when operating at a frequency of about 10 GHz), and this drastically reduces the number of obtainable circuits using the same semiconductor wafer (for example GaAs).

One method of reducing circuit dimensions would be to form transmission lines or, in general, structures which by suitably slowing down the signal phase velocity v also reduce its wavelength $\lambda$ (given by the relationship $\lambda = v/f$, where f is the signal frequency).

Numerous attempts have already been made to attain this result by constructing transmission lines using a support which instead of being constituted, as usual, by a semi-insulating semiconductor wafer, comprises a small suitably doped layer in order to strongly modify the lines of force of the electric field.

These structures, which are able to considerably shorten the signal wavelength, have not however found any practical application up to the present time because of the excessive signal losses which arise.

The object of the present invention is to provide a signal transmission structure which enables the signal wavelength to be shortened even to a considerable extent, with only low signal losses.

This object is attained according to the invention by a transmission structure (lines or waveguide), comprising at least two parallel conducting bands disposed on a support of semi-insulating semiconductor material, and electrically interconnected by concentrated capacities at predetermined distances apart which are less than the wavelength of the signal to be transmitted.

It has been found that with a transmission structure of this type it is possible to obtain signal wavelength reduction factors which reach 8, and by using suitable special means even 30, with respect to its value in a vacuum.

Furthermore, attenuation per unit of reduced wavelength has been found, as a first approximation, to be equal to $e^{-\pi/Q_c}$, where $Q_c$ is the Q-factor of the concentrated capacities. This means that the wavelength can be reduced considerably without substantially penalising losses, which in any case are very small.

The characteristics of the present invention will be more apparent from the detailed description given hereinafter of some possible embodiments thereof, illustrated by way of nonlimiting example in the accompanying drawings in which.

The transmission structure shown in FIGS. 1 to 4 comprises a support 1 of insulating semiconductor material on which are disposed two parallel conducting bands (or "plane earths") 2 connected together by transverse connecting strips 3. A longitudinal strip 4 of dielectric material such as silicon dioxide ($SiO_2$) is deposited in an intermediate position on the support 1 and on the connecting strips 3, and is superposed by a further conducting band (or "central conductor") 5. Both the conducting bands 2 and 5 and the connecting strips 3 can be constructed of the most suitable metals, for example gold, deposited in any manner.

Figure 1:
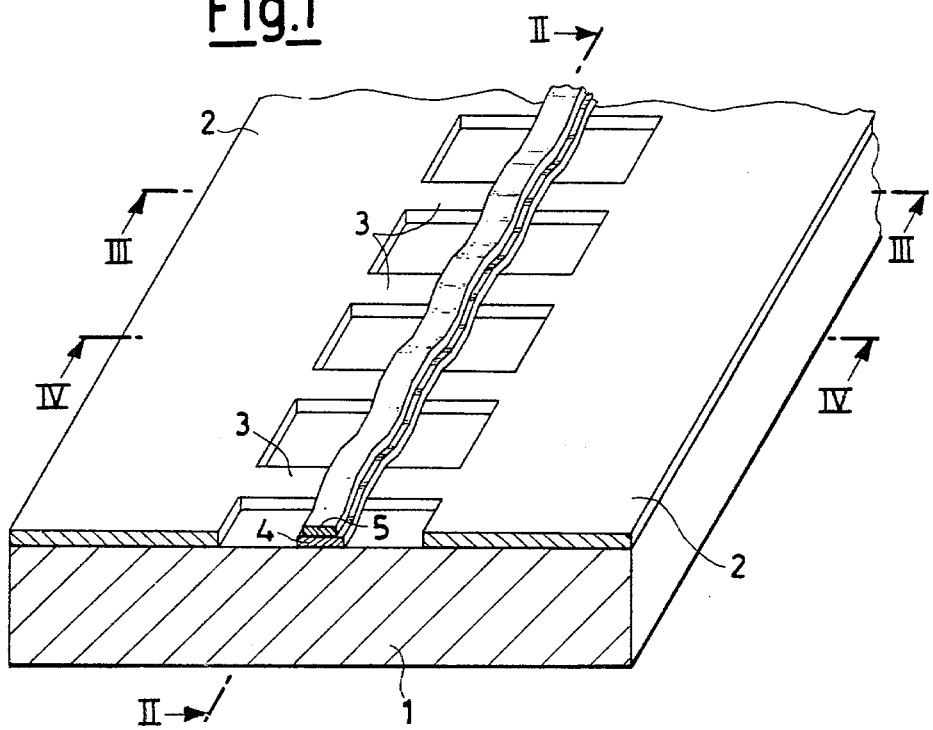
FIG. 1 is a perspective view of a first embodiment of a transmission structure according to the present invention.
Figure 2:
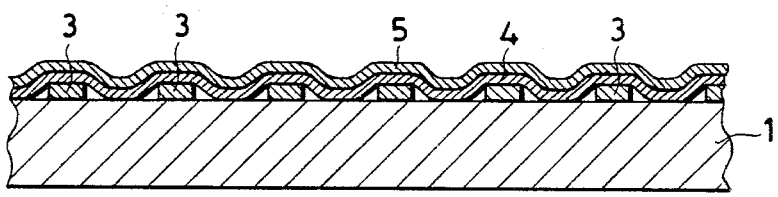
FIG. 2 is a longitudinal section through said transmission structure on the line II—II of FIG. 1.
Figure 3:
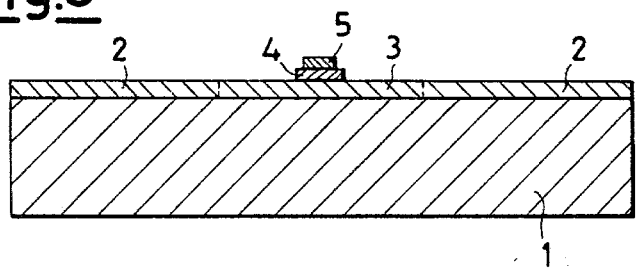
FIG. 3 is a cross-section through said transmission structure on the line III—III of FIG. 1.
Figure 4:
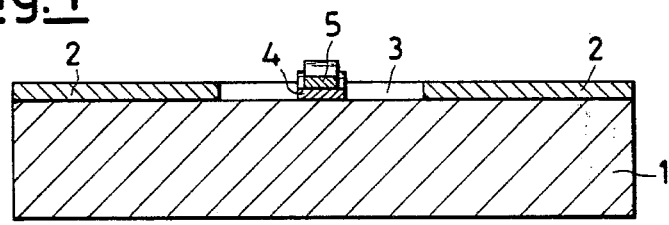
FIG. 4 is a cross-section through said transmission structure on the line IV—IV of FIG. 1.
Figure 5:
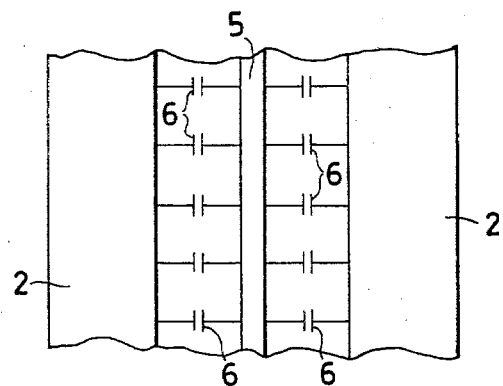
FIG. 5 is a plan view of the said transmission structure in the form of a diagram illustrating the underlying principle.

A succession of conentrated capacities 6 (FIG. 5) is thus formed between the central conductor 5 and the plane earths 2, and are repeated periodically at predetermined distances chosen such that they are less than the wavelength of the signal to be transmitted, and preferably small in relation thereto.

Experimental tests carried out with a transmission structure such as that shown in FIGS. 1 to 5, and constituting a coplanar line having a characteristic impedance of about 90$\Omega$ charged by capacitors prepared by vapour deposition of silicon dioxide ($SiO_2$) having a thickness of about 0.2 $\mu$m, have shown that a structure of this type is able to reduce the signal wavelength by a factor of about 8 relative to its wavelength in a vacuum.

By suitably shaping the central conductor 5 and connection strips 3 it is also possible to multiply by 16 the value of the concentrated capacity per unit of length, thus obtaining signal wavelength reductions which can reach a factor exceeding 30.

With regard to losses, when working at 10 GHz with concentrated capacitors having a Q-factor ($Q_c$) of approximately 300, losses of less than 0.1 dB/reduced wavelength were found, and thus very small.

One important application of the transmission structure of FIGS. 1 to 5, and generally according to the invention, has been found to be the construction of miniaturised directional couplers for monolithic integrated circuits.

Figure 6:
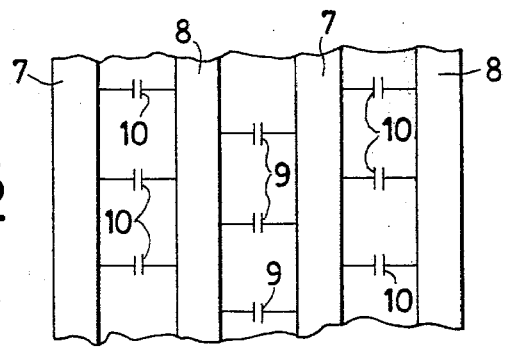
FIG. 6 shows a miniaturised directional coupler for monolithic integrated circuits utilising the principle of the transmission structure shown in the preceding figures, again in the form of a diagram illustrating the underlying principle.

These can use two lines such as those of FIGS. 1 to 5 disposed side-by-side and electrically connected together by concentrated capacities disposed at predetermined distances apart which are less than the signal wavelength, or two lines likewise disposed side-by-side and connected together by concentrated capacities 9 but each constituted by only two parallel conducting bands 7 and 8 connected together by concentrated capacities 10 (FIG. 6).

Figure 7:
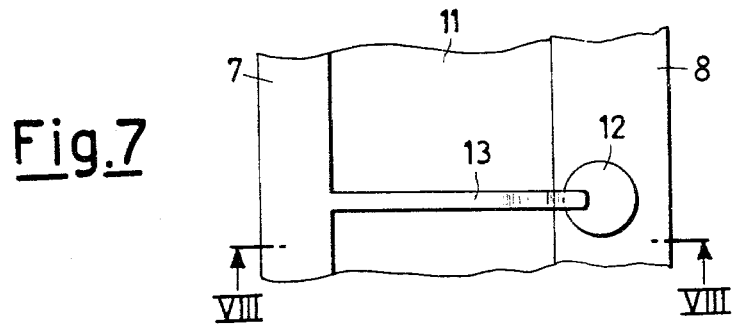
FIG. 7 is a plan view of a second embodiment of a transmission structure according to the invention.
Figure 8:
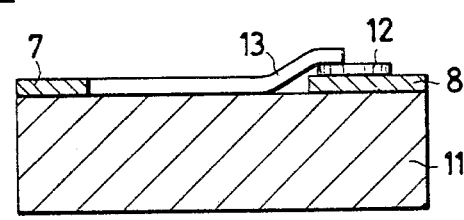
FIG. 8 is a cross-section through said second transmission structure on the line VIII—VIII of FIG. 7.

One line example of this type is shown in FIGS. 7 and 8, and comprises two conducting bands 7 and 8 disposed on a support 11 of semi-insulating semiconductor material and connected together by concentrated capacities each formed by depositing on the conducting band 8 a layer 12 of dielectric material (for example $SiO_2$) on which is then superposed a terminal portion of a transverse strip of conducting material 13 branching from the conducting band 7.

Figure 9:
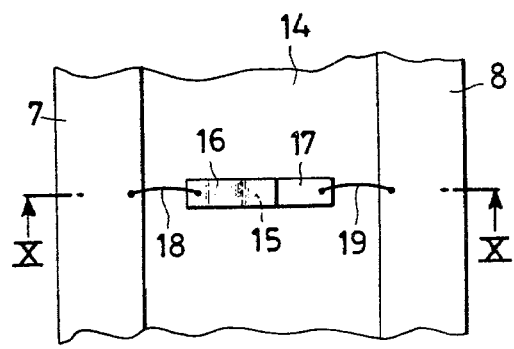
FIG. 9 is a plan view of a third embodiment of a transmission structure according to the invention.
Figure 10:
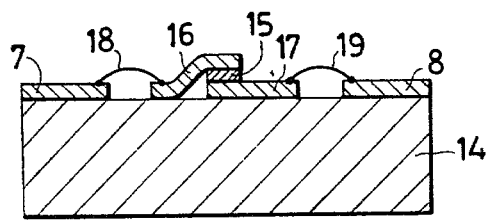
FIG. 10 is a cross-section through said third transmission structure on the line X—X of FIG. 9.

A further example is shown in FIGS. 9 and 10, which comprises two conducting bands 7 and 8 disposed on an insulating semiconductor support 14 and connected together by concentrated capacities each formed by disposing two small areas of conducting material 16 and 17 one above the other with a layer of dielectric material 15 therebetween, and electrically connecting them to the conducting bands 7 and 8 by conducting wires 18 and 19.

Semi-insulating semiconductor material forming supports such as support 11, for example, may be of material and having properties normally connected with such known material. Considering its low carrier-concentration, intrinsic, gallium arsenide is poorly conductive and is referred to as "semi-insulating". Such semiconductor material has a resistivity which exceeds $10^5$–$10^6$ ohm cm. and is greatly used in microwave circuitry. GaAs has great importance for its use in the technology of microwave monolithic circuits, particularly as a semi-insulating semiconductor support for transmission lines. For the present purposes, GaAs is only presented as an example since in the present invention any kind of semi-insulating semiconductor material can be employed as a transmission line supporting member without jeopardizing the performance of the structure.

Many other equivalent embodiments of the transmission structure according to the invention are possible.

I claim:

1. A periodic transmission structure for slow wave signals, for miniaturised monolithic circuit elements operating at microwave frequency, comprising at least two parallel conducting bands disposed on a support of semi-insulating semiconductor materials and electrically interconnected by concentrated capacities at predetermined distances apart which are less than the wavelength of the signal to be transmitted.

2. A structure as claimed in claim 1, wherein said predetermined distances are chosen small relative to the signal wavelength.

3. A structure as claimed in claim 1, wherein said parallel conducting bands comprise two lateral plane earths interconnected by transverse conducting strips and a central conductor passing over said transverse strips by way of a layer of dielectric material, the zones within which said central conductor is superposed on said transverse strips by way of dielectric material constituting said transverse capacities.

4. A structure as claimed in claim 1, wherein said parallel conducting bands comprise a first band on which areas of dielectric material are superposed, and a second band from which transverse strips branch to terminate on said areas of dielectric material in order to constitute said concentrated capacities.

5. A structure as claimed in claim 1, wherein said parallel conducting bands include a first and a second band connected by electrical conductors to conducting areas superposed by way of intermediate dielectric material, to constitute said concentrated capacities.

6. A structure as claimed in claims 3, 4 or 5, wherein said dielectric material is silicon dioxide.

* * * * *